(12) United States Patent
Weibler et al.

(10) Patent No.: US 6,686,818 B1
(45) Date of Patent: Feb. 3, 2004

(54) REVERBERATION CHAMBER TUNER AND SHAFT WITH ELECTROMAGNETIC RADIATION LEAKAGE DEVICE

(75) Inventors: Joseph Weibler, West Chicago, IL (US); Matthew Squire, Palatine, IL (US); Stan Zielinski, Glendale Heights, IL (US); Dale Svetanoff, Monticello, IA (US); Michael Slocum, Colonial Beach, VA (US); Michael O. Hatfield, Fredericksburg, VA (US)

(73) Assignee: The Curran Company, Glendale Heights, IL (US)

(*) Notice: Subject to any disclaimer, the term of this patent is extended or adjusted under 35 U.S.C. 154(b) by 0 days.

(21) Appl. No.: 09/936,135

(22) PCT Filed: Mar. 8, 2000

(86) PCT No.: PCT/US00/06214

§ 371 (c)(1),
(2), (4) Date: Feb. 19, 2002

(87) PCT Pub. No.: WO00/54365

PCT Pub. Date: Sep. 14, 2000

Related U.S. Application Data

(60) Provisional application No. 60/123,480, filed on Mar. 9, 1999.

(51) Int. Cl.⁷ .................................................. H01P 7/00
(52) U.S. Cl. .................... 333/231; 333/232; 324/637; 324/638
(58) Field of Search ................................. 333/231, 232; 324/637, 638

(56) References Cited

U.S. PATENT DOCUMENTS 4,777,459 A * 10/1988 Hudspeth .................... 333/135
5,530,412 A * 6/1996 Goldblum ................... 333/232

* cited by examiner

Primary Examiner—Robert Pascal
Assistant Examiner—Kimberly E Glenn
(74) Attorney, Agent, or Firm—Cherskov & Flaynik

(57) ABSTRACT

A tuner (10) for a reverberation chamber is provided comprising a plurality of electrically conductive surfaces (12) attached to each other in a Z-fold configuration. Each lateral edge (15) of the tuner is contacted with a generally planar, laterally positioned substrate (16) which prevents lateral extension or medial compression of the Z-fold. Optionally, end substrates (18) are attached to each of the two leading edges (17). Also, a device minimizes electromagnetic radiation leakage along a shaft including: a bearing housing; a plurality of thrust bearings contacting the bearing housing and axially juxtaposed along the shaft so that at least two thrust bearings oppose each other; a radial bearing intermediate each thrust bearing; and a provision for adjustably moving the thrust bearings toward each other so as to compress the thrust bearings against the bearing housing.

19 Claims, 8 Drawing Sheets

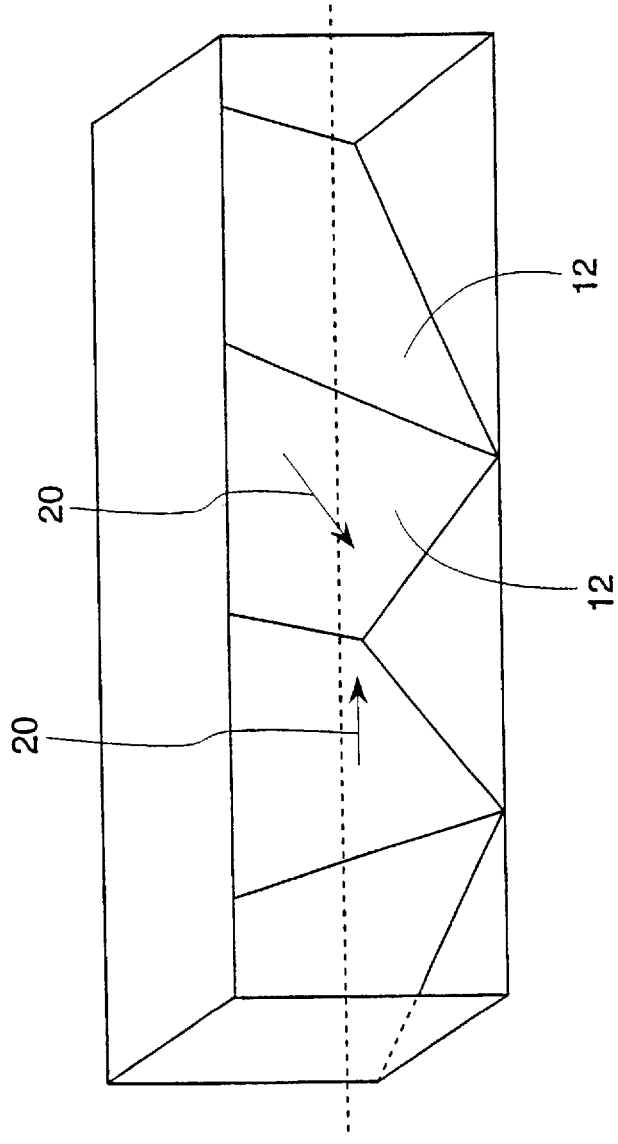
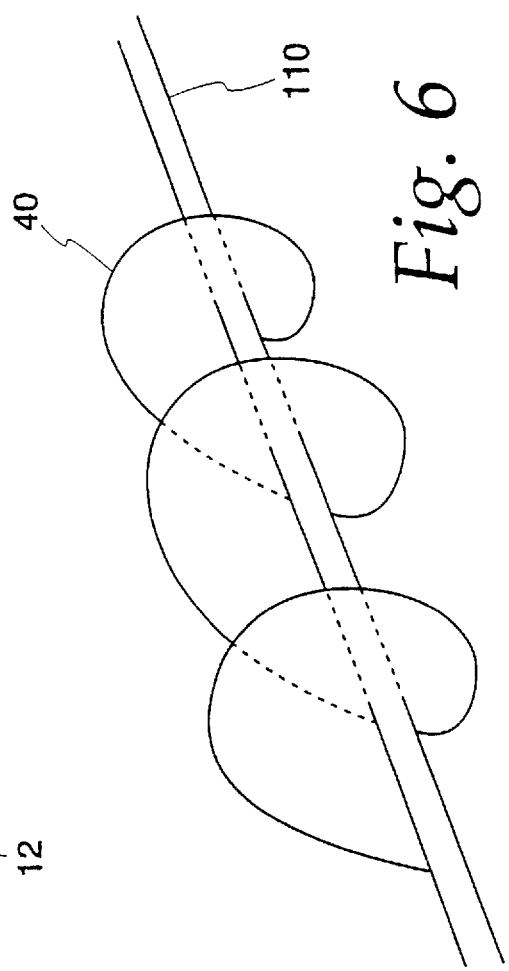
Fig. 5
Fig. 6

REVERBERATION CHAMBER TUNER AND SHAFT WITH ELECTROMAGNETIC RADIATION LEAKAGE DEVICE

This application claims the benefit of provisional application Ser. No. 60/123,480 filed Mar. 9, 1999.

BACKGROUND OF THE INVENTION

1. Field of the Invention

This invention relates to electromagnetic radiation diffuisers and more specifically, this invention relates to tuners used in reverberation chambers and their mounting in reverberation chambers.

2. Background of the Invention

Modern environments are awash in electromagnetic radiation due to the concentration, of transmitting devices. Also, most electrical equipment generates electromagnetic radiation during operation. Some electrical devices are adversely effected by this ubiquitous radiation. For example, devices associated with anti-lock braking systems in automobiles should be immune from rf frequencies emanating from electric motors or two-way radios operating nearby. Therefore, specific:testing standards mandate that some devices be tested in a controlled environment.

Reverberation chambers, anechoic chambers, and open area test sites (OATS) provide these controlled environs. However, reverberation chambers are more advantageous, inasmuch as test E-fields in the hundreds or thousands of volts per meter can be achieved using relatively low power sources such as 10 to 100 watt amplifiers.

Reverberation chambers are enclosures which contain electromagnetic radiation originating from within but exclude external ambient radiation. These chambers have inside surfaces which reflect the impinging radiation. They are used primarily to test the immunity of electronic equipment toward certain frequencies. Such chambers may be used to determine the frequencies emanating from a "device under test" (DUT). Typical DUTs include computer equipment, magnetic resonance imagers, avionics equipment, automobiles, and cellular phones.

The use of reverberation chambers continues to increase due to manufacturer test standards mandating their use. Also, the data-gathering speed associated with reverberation chambers versus the other methods described supra make chamber testing the preferred mode of analysis. As such, DUT traffic through reverberation chambers is increasing. To handle this increased traffic, reverberation chamber operations should assure rapid and accurate data collection.

Electromagnetic Comparability (EMC) testing standards which mandate or permit use of reverberant chambers require chamber calibration factors and chamber uniformity data. While this information is typically collected when the chamber is installed, recalibration and therefore retesting is required on a periodic basis. To avoid chamber down-time, this recalibration or retesting must be performed on an expedited basis.

Conventional methods of chamber testing include large metallic paddles or stirrers to mix, tune, or stir the fields within the chamber. This ensures that DUTs are exposed to uniform field strengths. The frequencies at which eigenmodes exist in a rectangular cavity of dimensions a, b and d are:

$$f_{mnl} = \frac{c}{2Pi\sqrt{u_r\varepsilon_r}}\sqrt{((mPi)/a)^2 + ((nPi)/b)^2 + ((lPi)/d)^2}$$

where c=speed of light;
m, n, and l are integers;
$u_r$=relative magnetic permeability; and
$\varepsilon_r$=relative dielectric permeability.

During recalibration, and to assure field homogeneity in the enclosures, particularly at frequency ranges of between 70 MHz and 150 MHz, tuners or frequency mixers are used to maximize boundary conditions or conversely, minimize the development of multiples of the frequencies studied. The tuners must be electrically large with respect to the enclosure and for the intended lowest frequency. Field homogeneity is achieved by exploiting the pseudo-statistical nature of each of the eigenfunction's contribution to the field level at a given point within the chamber volume.

Simple reflective surfaces in the shape and having the operation of paddles or fans often are utilized as tuners. Other configurations include Z-fold surfaces which resemble stair steps arranged either along the horizontal, vertical or intermediate axes of the enclosure. Such Z-fold surfaces are rotated about the longitudinal axis of the Z-fold assembly.

Tuners are utilized either as mode-stirrers or mode tuners. Mode stirrers provide continuous movement of the reflective surfaces of the tuners. The data is measured for many different rotational positions of the tuner and for each frequency at any given power level. This is because field uniformity inside the volume of the chamber can only be obtained by averaging the fields influenced by the tuner over each tuner rotation. For optimum performance, these stirrers must exhibit low-flutter during their operation. Typical equilibration problems associated with mechanical stirrers have prompted some researchers to develop electronic mode stirring devices (See U.S. Pat. No. 5,327,091 issued to Loughry on Jul. 5, 1994). However, such electronic devices are relatively costly compared to their mechanical counterparts.

A mode tuner, on the other hand, is "stepped" through its complete rotation, with frequency measurements taken after the tuner stops at each step. To expedite testing using mode tuners, minimal vibration or settling time is desired. It is also possible to set a frequency and step the tuner through its required positions.

Mode tuners aregenerally more desirable when testing at lower frequencies. A typical test sequence will include turning a tuner to a given position, stepping (or sweeping) the frequency source through the desired range of frequencies, and then incrementing the tuner to the next position for a cycle repeat. However, if tuners with fast settling times are available, the tuner can be stepped through all if its required positions while measurements are taken at a single frequency.

The operation of mode tuners requires fast, precision mechanical tuner drivers and a tuner structure that either requires little mechanical dampening or which has naturally fast settling times. However, it is common for some fan tuners to exhibit settling times of up to 10 seconds, which is unacceptable in high through-put scenarios. As immunity test standards at lower frequencies increase, the larger tuners required to accommodate the longer wavelengths of these frequencies will tend to have larger rotational moments due to their increased mass. These larger tuners represent a challenge for maintaining tight, fast control of their stepped positions. While precision stepper motors provide the needed drive, total mass of the tuner structure is critical, as is optimizing feedback settings of the motor controller amplifiers.

Many reverberation chamber tuners have a single support structure or center shaft from which electrically conductive surfaces are radially mounted. ( See, for example, U.S. Pat. No. 5,530,412 issued to Goldblum on Jun. 25, 1996.) The larger the surfaces, the higher the rotational moment of inertia associated with their movement. This leads to increased settling times, and therefore the problems discussed, supra A need exists in the art for tuners or stirrers which contain large conductive surfaces. The tuners/stirrers should also exhibit minimal settling times, while also maintaining relatively low mass. The mounting and mechanical drive means for the tuners or stirrers also should minimize the introduction of electromagnetic radiation into the chamber in which they are operating.

SUMMARY OF THE INVENTION

It is an object of the present invention to provide a device for tuning reverberation chambers that overcomes many of the disadvantages of the prior art.

Another object of the present invention is to provide a tuner for a reverberation chamber to accommodate electromagnetic radiation frequencies of as low as 20 MHz. A feature of the invention is a plurality of support members juxtaposed to electrically conductive surfaces of the tuner. An advantage of the invention is the short settling time (i.e. fast dampening time) displayed by the supported tuner.

Yet another object of the present invention is providing a tuner which minimizes the encroachment of electromagnetic radiation into a reverberation chamber. A feature of the invention is a bearing feed-through mechanism for mounting the actuating shaft of the tuner that eliminates rf leakage from the outside to the inside of the enclosure and just as importantly, from the inside of the enclosure to the outside. Another feature of the invention is the use of an externally situated actuating motor for moving the tuner. An advantage of the invention is that the tuner does not add to the burden of excluding ambient electromagnetic radiation from the chamber. Another advantage is that the need for additional filters and the compensation for metallic motor structures is obviated.

Briefly, the invention provides for a tuner in a reverberation chamber comprising a plurality of electrically conductive surfaces attached to each other in a Z-fold configuration so as to form an elongated substrate having a longitudinal axis, two lateral edges extending generally parallel to the longitudinal axis, and two leading edges extending generally perpendicular to the longitudinal axis; a first and second planar substrate attached to each lateral edge; and a third and forth planar substrate attached to each leading edge and also attached to each first and second planar substrate.

Also provided is a device for minimizing electromagnetic radiation leakage along a shaft comprising a bearing housing; a plurality of thrust bearings contacting the bearing housing and axially juxtaposed along the shaft so that at least two thrust bearings oppose each other; a radial bearing intermediate each thrust bearing; and a means for moving the thrust bearings toward each other so as to compress the thrust bearings against the bearing housing.

BRIEF DESCRIPTION OF THE DRAWING

The present invention together with the above and other objects and advantages may best be understood from the following detailed description of the embodiment of the invention illustrated in the drawing, wherein:

FIG. 5 is an elevational view of another exemplary mode-tuning device, in accordance with features of the present invention;

FIG. 6 is an elevational view of yet another exemplary mode-tuning device, in accordance with features of the present invention;

DETAILED DESCRIPTION OF THE INVENTION

The invention provides a reverberation chamber tuner which exhibits a fast "settling time" and therefor allows a faster testing time of DUTs.

The invention also provides an external motor mounting system relative to the interior of the enclosure or testing environment. A unique feed through bearing system allows the exterior motor to turn the tuner while maintaining the required RF shielding specification. This mounting of the motor on the outside of the chamber eliminates the need for filtering and shielding the motor inside the chamber. An externally mounted motor also allows for larger tuners, which translates into greater mode-tuning efficiencies.

As demonstrated infra, the invented tuner and its mounting configuration provide beneficial boundary change effectiveness versus tuner width. Test time reductions versus tuner settling times also are demonstrated. Additional technical detail of the invented tuner and the performance thereof is included in the technical paper D. Sventanoff, et al, entitled "Development of High Performance Tuners for Mode-Stirring and Mode-Tuning Applications," (ISBN No. 0-7803-5057-X/99) which was published in the *Proceedings of the 1999 IEEE International EMC Symposium*, Vol. 1, pp. 29–34, Seattle, Wash., Aug. 2, 1999, and incorporated herein by reference.

Tuner Construction Detail

Figure 1:
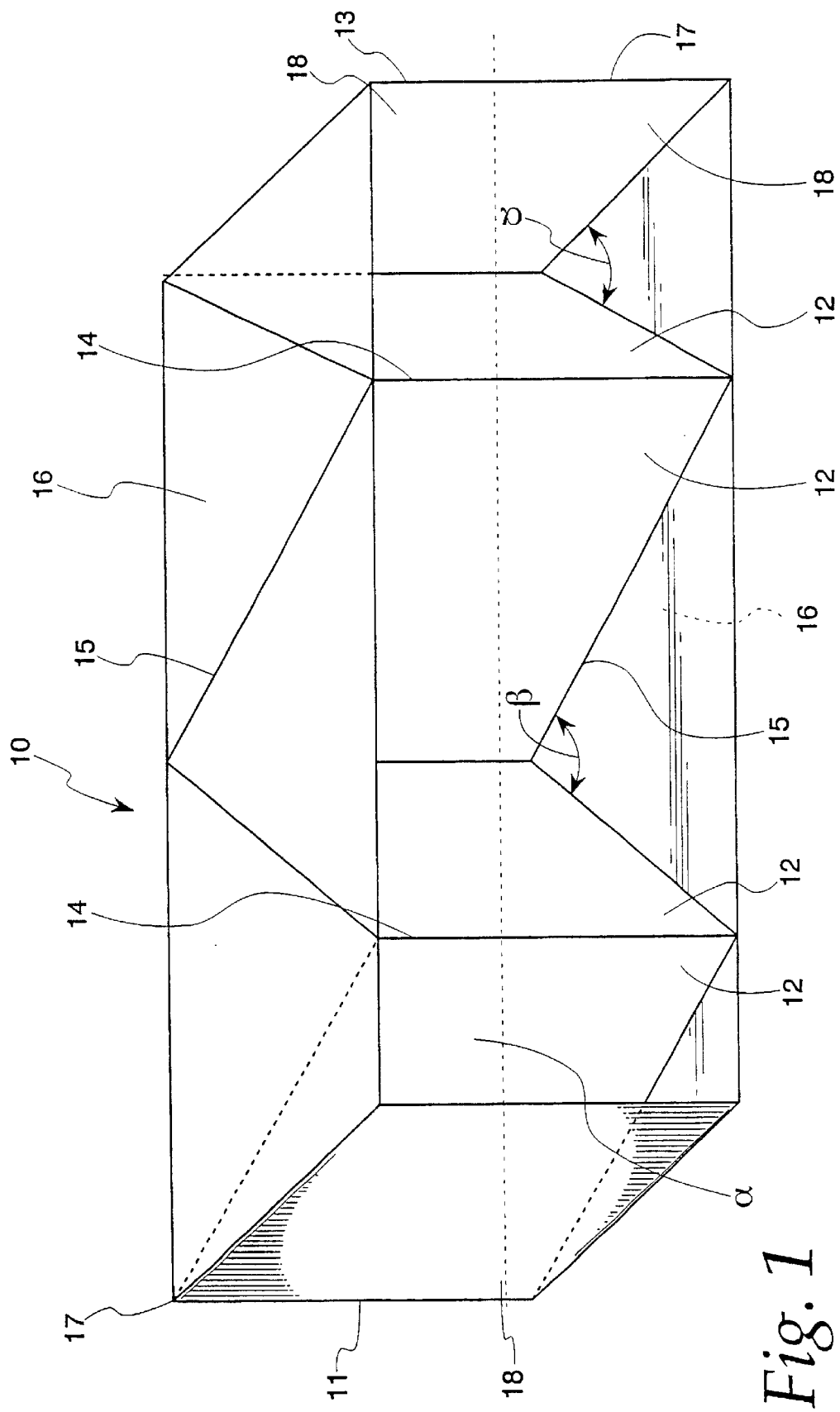
FIG. 1 is an elevational view of an exemplary mode-tuning device, in accordance with features of the present invention.

The invented Z-fold tuner is depicted in FIG. 1 as numeral 10. The tuner has a first end 11 and a second end 13. The tuner consists of a plurality of generally planar adjacent, electrically-conductive substrates 12 each substrate attached to another at two opposing edges so as to define a stair-step or Z-fold configuration. This Z-fold configuration results in the formation of two lateral edges 15 which extend generally parallel to the longitudinal axis a of the tuner. The tuner also has two leading edges 17 which extend perpendicular to the longitudinal axis of the tuner and comprise the unattached edges of the first and last substrates of the Z-fold to adjacent substrates.

Each lateral edge 15 of the tuner is contacted with a generally planar, laterally positioned substrate 16. This planar substrate is attached so as to prevent lateral extension or medial compression of the Z-fold. Optionally, end substrates 18 are attached to each of the two leading edges 17 of the tuner and also perpendicularly to the planar substrate 16.

Depending on the settling requirements of the tuner and weight restrictions, any or all of the four boundary substrates (i.e., the two end substrates 18 and the two longitudinally extending substrates 16) can be rigid. Generally, the end substrates and the laterally positioned, longitudinally extending substrates 16 are opaque and/or solid. As such, the reflective surfaces of the tuner are those physically accessible, which surfaces primarily define the longitudinally extending surface defining the Z-fold.

Figure 2:
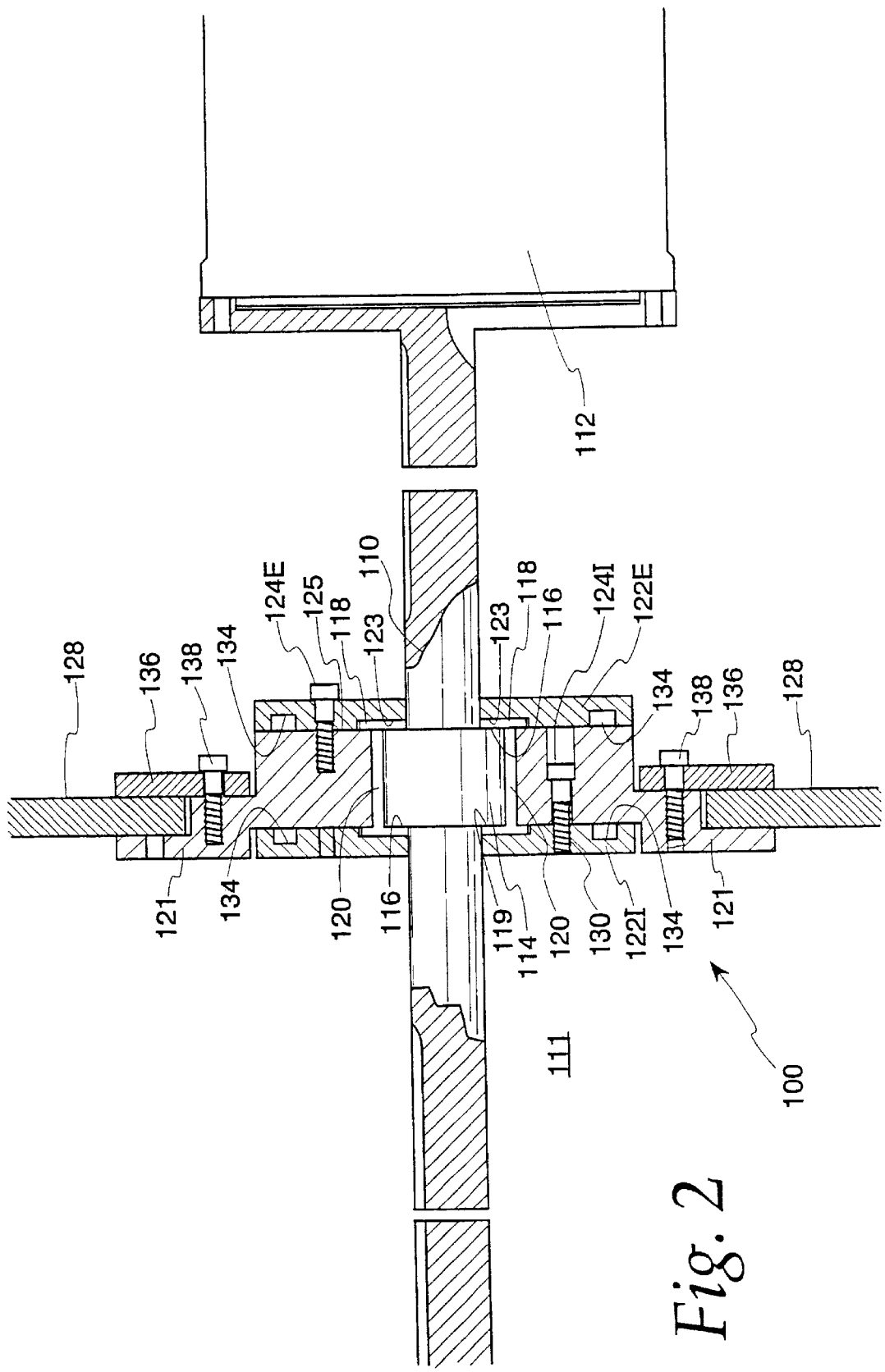
FIG. 2 is an elevational view of an exemplary mode-tuning device, in accordance with features of the present invention.

The tuner is actuated in a myriad of ways. For example, a rotatable shaft (element 110 on FIG. 2) can extend co-axially with the longitudinal axis 17 of the tuner. Alternatively, where longitudinally-extended shafts are not utilized, the end caps 18 of the tuner are rigidified or otherwise reinforced to sustain any rotational torque applied thereto to effect tuner rotation. The shaft is attached to an end cap via a myriad of fastening means, including, but not limited to standard chuck configurations (wherein a region of the end cap defines a stub shaft), male-female threaded configurations (wherein the end cap 18 defines a female threaded aperture so as to receive a threaded end of the rotating shaft), or clamp.

Rigidifying the tuner in the manner disclosed supra results in settling times that are one- to two-orders of magnitude lower than the settling times obtained from current tuners.

This rigidifying also provides a tuner with exceptionally good field homogeneity capabilities, even at extremely low frequencies of 80 MHz or less.

It should be noted that the angles β and γ effected by the joining of successive adjacent conductive surfaces are dissimilar. These angle variances minimize any redundancy in the reflective surfaces, thereby maximizing boundary regions or creating a more varied boundary region to be experienced by the impinging waves.

Rotation of the tuner is enhanced when a principal axis of inertia of the tuner coincides with the rotational axis 17 and the shaft 110.

Figure 4:
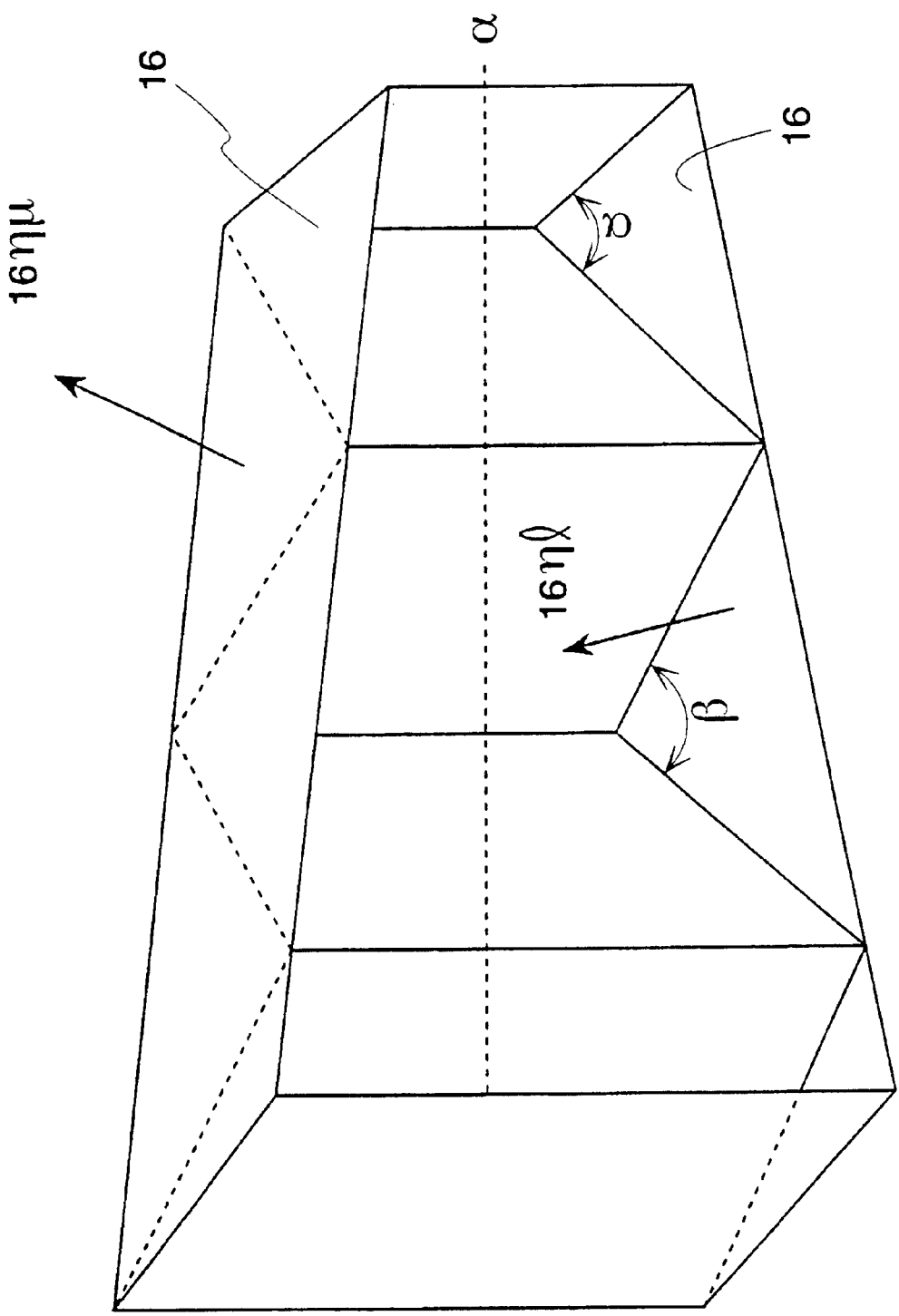
FIG. 4 is an elevational view of an exemplary mode-tuning device, in accordance with features of the present invention.

The basic tuner structure illustrated in FIG. 1 can be advantageously modified in a myriad of ways, some of which are illustrated in FIGS. 4 through 7. Some of these modifications can be best characterized by analyzing the relative orientations of vectors normal to the surfaces in question. In FIG. 4 the top and bottom planar substrates 16 are not parallel to the longitudinal axis a but one may draw normal vectors 16nu and 16nl therefrom that are coplanar with the longitudinal axis. Alternatively, the stirrer is configured so that the normal vectors 16nl, 16nu, and the axis 17 are not coplanar, i.e., where the top and bottom surfaces are twisted with respect to each other.

Similarly, FIG. 5 illustrates an embodiment where the longitudinal axis a and vectors 20 normal to the electrically conductive surfaces 12 are not coplanar. Further possible modifications are combining the features of FIGS. 4 and 5 or utilizing non planar conductive surfaces 12.

Figure 7:
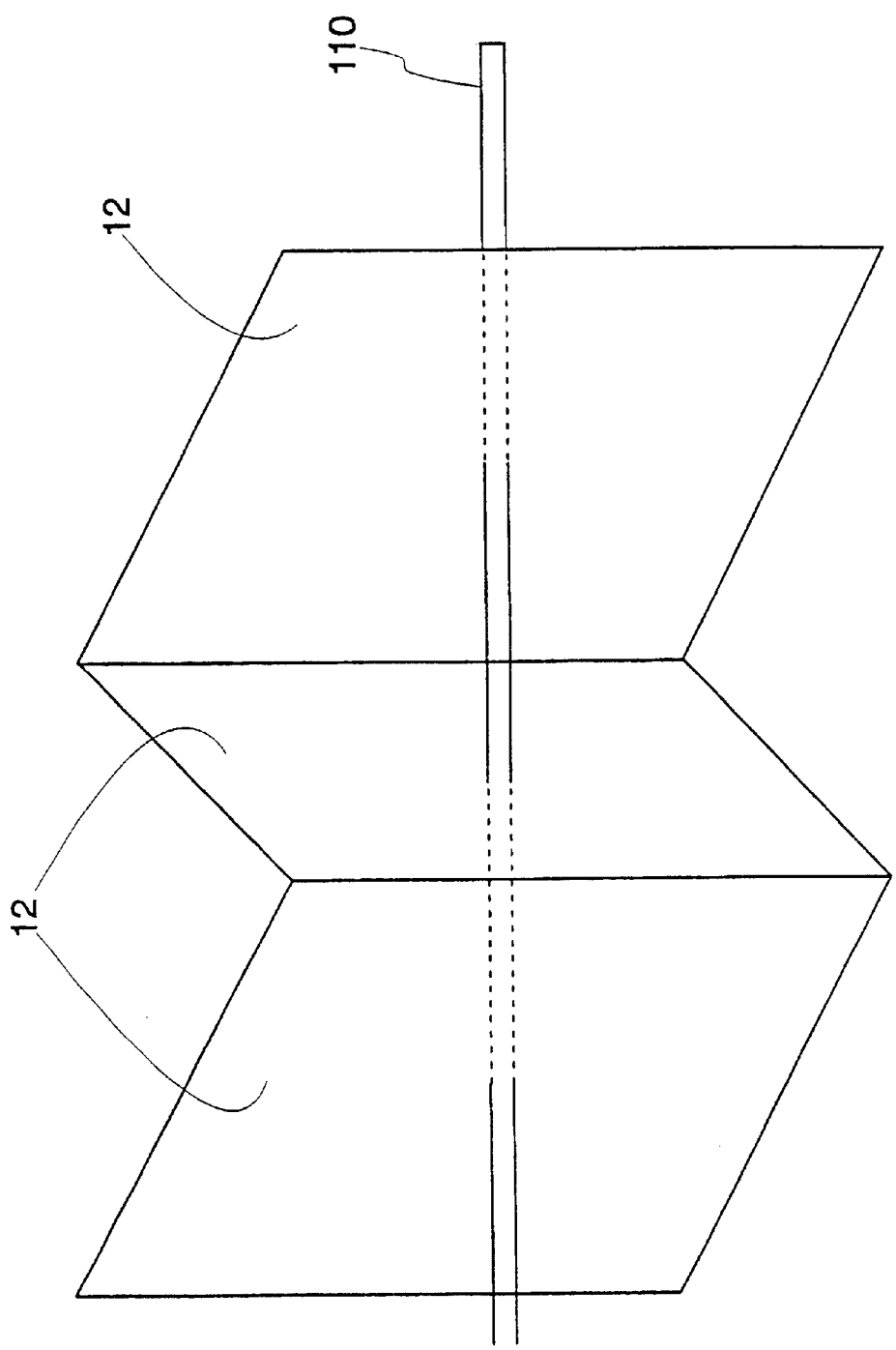
FIG. 7 is an elevational view of yet another exemplary mode-tuning device, in accordance with features of the present invention.

FIG. 6 illustrates a tuner where the conducting surfaces 12 are replaced by a continuous helical conducting surface 40 anchored to the shaft 110. The helix may be made with a non uniform pitch. FIG. 7 illustrates a Z-fold configuration of surfaces 12 analogous to the configuration in FIG. 1 but with said surfaces 12 anchored to the shaft 110. The configurations in FIGS. 6 and 7 have the advantage of a smaller moment of inertia for the tuner structure.

All of the stirrers disclosed herein provide performance superior to typical configurations, inasmuch as the invented designs suppress undesired eigenmodes.

Shaft Mounting Detail

The invention also provides a device for minimizing electromagnetic radiation encroachment along a shaft which ultimately is rotated to actuate a tuner in a reverberation chamber. By means of a penetration shaft, this device provides coupling between the "paddle" shaft 110 of the tuner and an externally located electric motor One embodiment of the device, designated as numeral 100 in FIG. 6, extends through a wall, ceiling or floor of the enclosure so as to prevent electromagnetic radiation leakage between the inside and outside of the enclosure.

Figure 3:
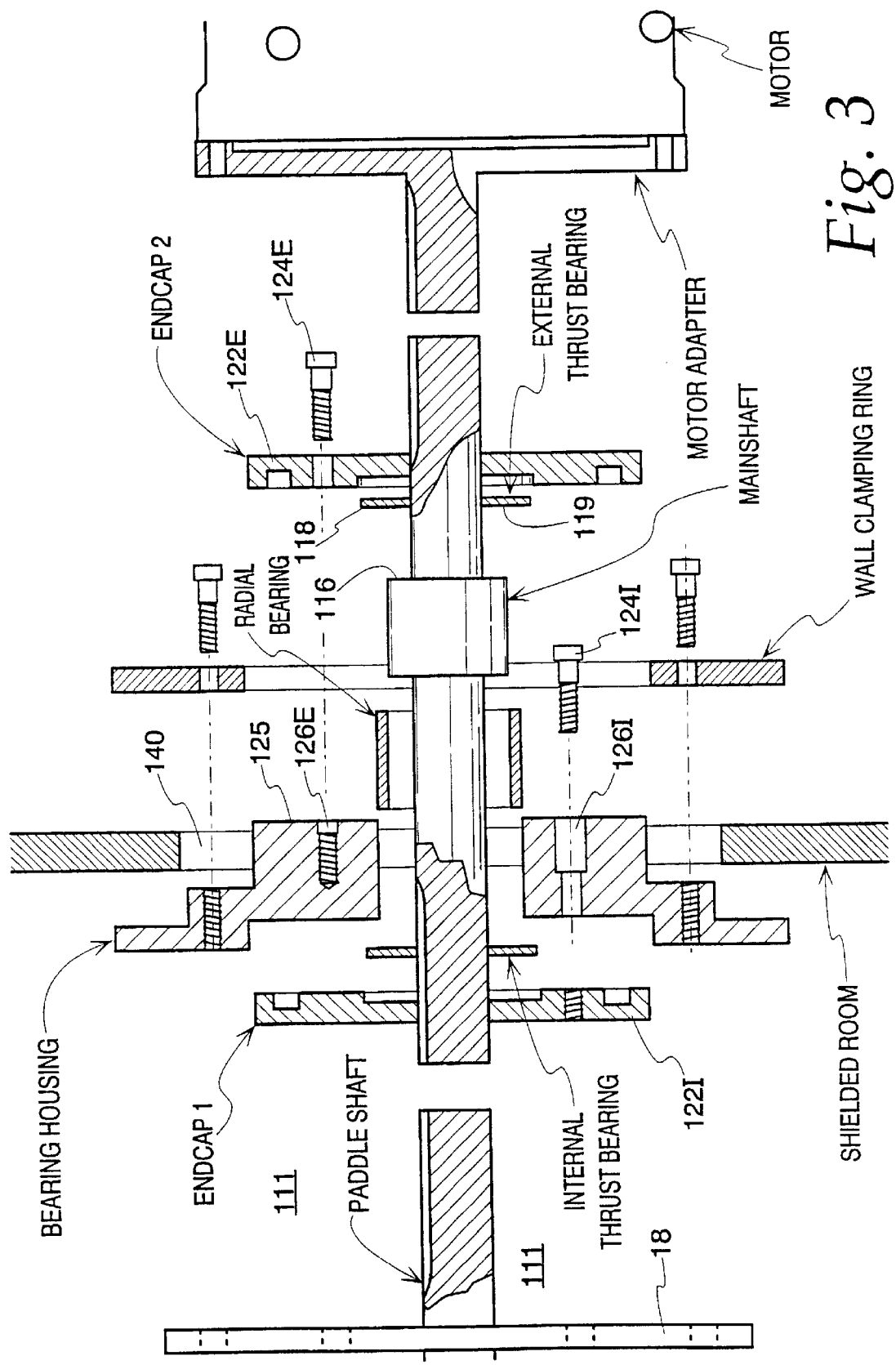
FIG. 3 is an elevational cutaway view of a mounting configuration of the tuning device, in accordance with features of the present invention.

There are five major components of the device which interact with the rotating shaft 110. These components are a bearing housing 121 flanked by an externally applied end cap, 122e, and an internally applied end cap 122i. Another depiction of the bearing housing is found in FIG. 3. The bearing housing is adapted to receive a pair of thrust bearings 118 which have the shape similar to washers. Intermediate the thrust bearings is a radial bearing 120, similar to a truncated cylinder or ring.

Adjustable RF sealing of the shaft by the bearing housing occurs when pressure is applied to the thrust bearings via the outside end cap 122e. In response to this mechanical pressure, a medially directed surface 119 of the thrust bearing 118 makes intimate electrical contact with a laterally facing surface 125 of the bearing housing 121, thereby effecting an RF seal.

The shaft 110 is actuated by a motor 112, itself external to the interior 111 of a reverberation chamber. One region of the shaft contains a radially directed, circumferentially extending annular region 114 so as to define laterally-facing surfaces 116 or shoulders. Contacting each of the laterally facing surfaces 116 are thrust bearings 118. As such, the thrust bearings are arranged opposing each other.

Intermediate the thrust bearings are radial bearings 120. The length of the radial bearings are such so as to allow medial displacement or movement of the thrust bearing 118 toward each other.

Medial movement of the thrust bearings are effected by mechanical pressure applied thereto. One means for applying pressure to the thrust bearings is via the pair of oppositely arranged end plates 122i, 122e. The external end plate 122e is actuated via a threaded bolt 124e matingly received by a threaded aperture 126e integral with the bearing housing.

Another portion of the bearing housing, which is diametrically opposed to the first threaded aperture 126i, forms a second aperture 126e to slidably receive a second threaded bold 124i. It is this bold that fastens the internal end plate 122i to the bearing housing 121. Once fastened to the bearing housing 121, the internal end plate 122i is static in that no appreciable movement of this plate is effected further tightening of the second bolt 124i. As such, any mechanical pressure adjustment to the thrust bearing 118 is effected via tightening or loosening of the threaded bold 124e which attaches the external end cap 122e to the bearing housing 121.

The bearing housing 121 is held in place at an opening 140 in the enclosure surface 128 via a plurality of clamping rings 136 and clamping ring bolts 138.

To assure adequate compression of the thrust bearings in a medial direction relative to the wall 128 of the enclosure, portions 123 of the end plates can be configured to accommodate less than the entire thickness of the thrust bearings. In such an arrangement, tightening or medially displacing the end plates will assure adequate electrical contact between the thrust bearings and the end plate.

Optionally, the end plates 122i, 122e have regions defining annular grooves 134 radially situated from the thrust bearing nesting sites. These annular grooves, are adapted to receive microwave absorbing material to further enhance rf shielding of the shaft mounting configuration.

The thrust bearings can be tuned to eliminate frequencies of interest. Generally between 2 and 50 foot pounds of torque is adequate.

The bearings 118, 120 are comprised of an oil-impregnated conductive substrate. One exemplary oil-impregnated substrate is oil-impregnated bronze. A commercially available oil-impregnated bronze is known as Oilite™, or Bost-Bronze™, the later of which is available through Boston Gear, of Boston, Mass.

Figure 8:
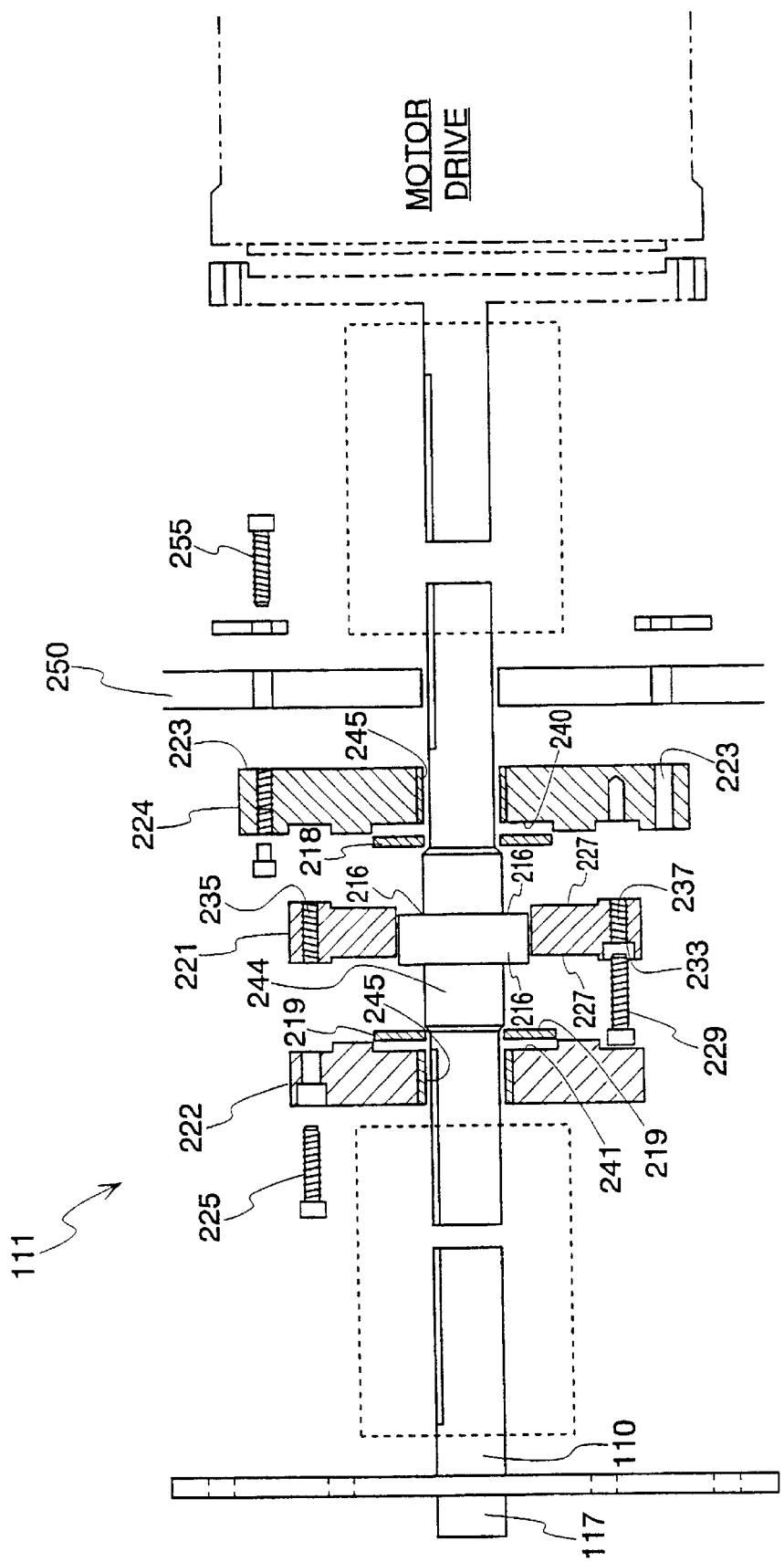
FIG. 8 is an elevational exploded view of a mounting configuration of the tuning device, in accordance with features of the present invention.
Figure 9:
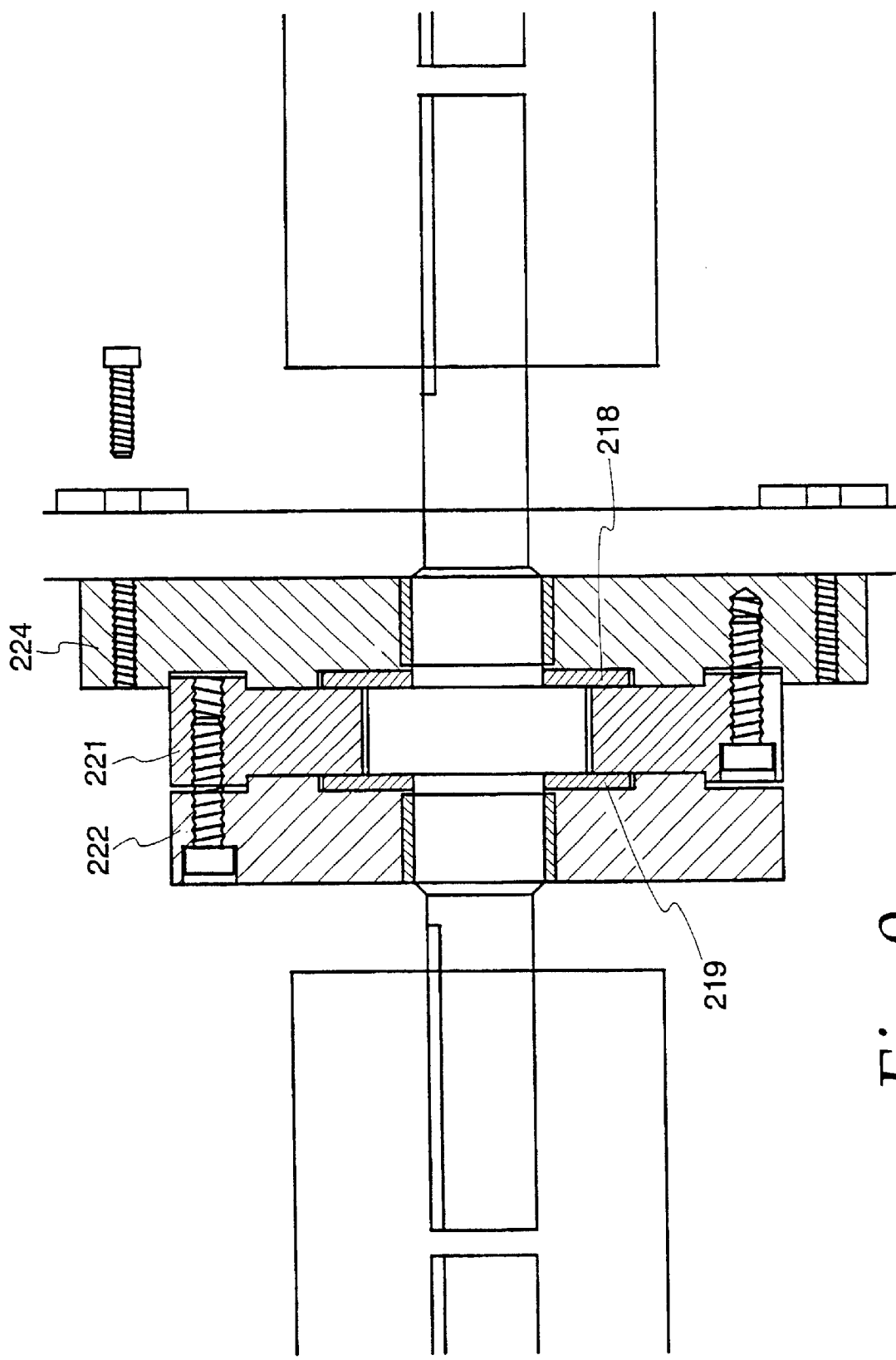
FIG. 9 is a collapsed view of the mounting configuration illustrated in FIG. 8.

A detailed illustration of another bearing assembly is designated as numeral 200 in FIG. 8. This second bearing assembly confers added stability to the shaft inasmuch as a plurality of radial bearings are present. Specifically, a base plate 224 and end cap 222 contain pressed-in radial bearings 245. These bearings support shaft 244 at two separate locations. The distance provided by this design allows for increased load support (i.e., a more extended load bearing surface.)

The major components of the bearing assembly interact with a rotating penetration shaft 244 which extends along the longitudinal axis of the tuner. These major bearing assembly components include the base plate 224 removably attached to a wall 250 of a test chamber, a locking hub 221 removably attached to the base plate 224, and an end cap 222 removably attached to the locking hub. The base plate 224, the end cap 222 and the locking hub 221 reversibly compress thrust bearings 218 situated on either side of the locking hub to facilitate RF sealing of the shaft 244 vis-a-vis the bearing assembly so as to prevent RF leakage along the shaft 244.

The tuner device is fastened to the wall 250 of the test chamber via the base plate 224. In one anchoring arrangement, regions of the base plate 224 define transverse apertures 223 in axial alignment with similar sized apertures in the wall so as to receive bolts 255 or other fastening means to secure the base plate to the wall.

Both the locking hub 221 and the end cap 222 are generally circular in configuration. The end cap 222 is situated concentric to the shaft and distal from the wall-base plate juncture. The locking hub 221 defines the locking hub regions defining apertures to receive fastening means A medially facing surface 240 of the base plate 224 contacts a first thrust bearing 218, arranged concentrically to the base plate and coaxial with the shaft 244. A medially facing surface 241 of the end cap 222 contacts a second, similarly configured thrust bearing 219.

The end cap 222 communicates with the shaft 244 via the radial bearings 245 juxtaposed intermediate the cap and shaft. The radial bearings are configured similar to truncated cylinders or rings. Each of these radial bearings contacts the penetration shaft 244. The length of the radial bearings is sufficient to allow them to act on the shaft 244 and to stabilize the rotating shaft.

A salient feature of the bearing assembly is that it affords adjustable, variable RF sealing of the shaft vis-a-vis the bearing housing. RF sealing is effected with axially applied pressure to the thrust bearings. Specifically, RF sealing occurs when pressure is applied to the thrust bearings 218 via first tightening fasteners 225 and second tightening fasteners 229.

The fasteners 225 are slidably received by regions of the end cap 222 forming apertures, circumferentially arranged about the end cap, so as to allow the fasteners to threadably engage with coaxially positioned threaded apertures 235 in the locking hub 221.

Another portion of the base plate 224 located radially inwardly from the anchoring aperture 223, forms a second aperture 226 adapted to slidably receive the second tightening fasteners 229. The bolt 229 comes to rest against a shoulder 233 which defines the periphery of a transverse aperture 237 defined by peripheral regions of the locking hub. The transverse aperture 235 and the second aperture 226 are coaxially aligned. In this configuration, the fastener 229 serves to removably attach the locking hub 221 to the base plate 224 and in the process creates an interference fit to lock down the thrust bearing 218. The end cap is fastened to the locking hub by means of the bolt 225 threaded into the hole 235. Once fastened to the base plate the locking hub is static. Similarly, once fastened to the locking hub, the end cap is adjustably held in place via a tab-in-slot interaction with the locking hub. It is in fact this adjustable interaction between the end cap and the locking hub which confers RF sealing variability and tuning to the bearing assembly. Generally, the tighter the end cap is held against the locking hub, the greater the RF seal. However, concomitant with increased tightening is the need for higher rotational force to actuate the shaft 244.

A medial region of the shaft 244 contains a radially directed, circumferentially 25 extending annular region 214, so as to define laterally-facing surfaces 216 or shoulders.

Contacting each of the laterally facing surfaces 216 are the thrust bearings 218 and 219. As such, the annular region is positioned intermediate the thrust bearings.

In summary, axially applied mechanical pressure via a fastening of the end cap 222 results in the laterally facing surfaces 216 of the annular region to contact the thrust bearings 218, 219 so as to establish electrical contact. This contact effects an RF seal. As discussed supra, increased axial pressure enhances the RF seal.

The shaft 109 is coupled to a motor 12, the latter of which is external to the interior 111 of the reverberation chamber and not a part of the bearing assembly described herein.

Enhanced rotating performance results when a distal end 117 of the tuner shaft is supported by wall- and/or floor-mounted idlers (not shown).

While the invention has been described with reference to details of the illustrated embodiment, these details are not intended to limit the scope of the invention as defined in the appended claims.

The embodiment of the invention in which an exclusive property or privilege is claimed is defined as follows:

1. A tuner for a reverberation chamber comprising:
    a) plurality of electrically conductive surfaces attached to each other to form a Z-fold configuration having a longitudinal axis, two lateral edges extending parallel to the longitudinal axis, and two leading edges extending perpendicular to the longitudinal axis;

b) a longitudinally-extending substrate attached to each lateral edge; and c) a non-longitudinally-extending substrate attached to each leading edge and also attached to each longitudinally extending substrate.

2. The tuner as recited in claim 1 wherein said non-longitudinally-extending substrates substrate are each attached perpendicularly to said longitudinally-extending substrates.

3. The tuner as recited in claim 1 wherein at least one longitudinally-extending substrate is rigid.

4. The tuner as recited in claim 1 wherein at least one non-longitudinally-extending substrate is rigid.

5. The tuner as recited in claim 1 wherein the Z-fold configuration is arranged so that the angles of attachment between any two adjacent surfaces differs from any angle of attachment of any other adjacent surfaces.

6. The tuner as recited in claim 1 and adapted to receive a shaft coaxial to the longitudinal axis, wherein said shaft transversely extends through the non-longitudinally-extending substrates.

7. The tuner as recited in claim 6 wherein the shaft extends through a first one of said non-longitudinally-extending substrate at an angle of approximately 90 degrees to the plane defined by the first non-longitudinally-extending substrate and wherein the shaft extends through a second one of said non-longitudinally-extending substrate at an angle of approximately 90 degrees defined by the second non-longitudinally-extending substrate.

8. The tuner as recited in claim 1 wherein the longitudinally-extending substrates and non-longitudinally-extending substrates are electrically transparent.

9. A tuner for a reverberation chamber comprising a plurality of electrically conductive surfaces attached to a longitudinal axis and to each other to form a Z-fold configuration having a longitudinal axis.

10. A tuner assembly for a reverberation chamber comprising:

a) plurality of electrically conductive surfaces attached to each other to form a Z-fold configuration having a longitudinal axis, two lateral edges extending parallel to the longitudinal axis, and two leading edges extending perpendicular to the longitudinal axis;

b) a first and second planar substrate attached to each lateral edge;

c) a third and forth planar substrate attached to each leading edge and also attached to each first and second planar substrate;

d) a shaft coaxial to the longitudinal axis, wherein said shaft transversely extends through the third and fourth planar substrate; and e) means to rotate said shaft comprising means to minimize electromagnetic radiation leakage along said shaft.

11. The tuner assembly of claim 10 wherein the device for minimizing electromagnetic radiation leakage along a shaft comprises:

a) a bearing housing;

b) a plurality of thrust bearings contacting the bearing housing and axially juxtaposed along the shaft so that at least two thrust bearings oppose each other; and c) a means for moving the thrust bearings toward each other so as to compress the thrust bearings against the bearing housing.

12. The device as recited in claim 11 wherein the thrust bearings are comprised of oil-impregnated conducting material.

13. The device as recited in claim 11 wherein the thrust bearings are comprised of oil-impregnated bronze.

14. The device as recited in claim 11 wherein the means for moving the thrust bearings comprise medially-applied pressure to the thrust bearings along a longitudinal axis of the shaft.

15. The device as recited in claim 14 wherein the pressure is adjustable to tune out specific electromagnetic frequencies.

16. The device as recited in claim 11 wherein the means for moving the thrust bearings comprise contacting a lateral surface of the thrust bearings with a medially directed rigid surface.

17. The device as recited in claim 16 wherein said rigid surface is adapted to receive a microwave absorber.

18. The device as recited in claim 17 wherein the microwave absorber contacts the bearing housing.

19. The device as recited in claim 11 comprising a medial locking hub against which said thrust bearings are compressed.

* * * * *